United States Patent [19]
Hori

[11] Patent Number: 6,151,259
[45] Date of Patent: Nov. 21, 2000

[54] SEMICONDUCTOR MEMORY DEVICE

[75] Inventor: Mineyuki Hori, Tokyo, Japan

[73] Assignee: NEC Corporation, Tokyo, Japan

[21] Appl. No.: 09/396,211

[22] Filed: Sep. 15, 1999

[30] Foreign Application Priority Data

Sep. 16, 1998 [JP] Japan .................................. 10-262109

[51] Int. Cl.$^7$ .................................................. G11C 7/00
[52] U.S. Cl. ...................................... 365/200; 365/225.7
[58] Field of Search ................................. 365/200, 225.7, 365/225.6, 96

[56] References Cited

U.S. PATENT DOCUMENTS

| | | | |
|---|---|---|---|
| 4,672,240 | 6/1987 | Smith et al. ............................. | 307/449 |
| 5,715,202 | 2/1998 | Harima .................................... | 365/200 |

FOREIGN PATENT DOCUMENTS 7-122096  5/1995  Japan .

*Primary Examiner*—Richard Elms
*Assistant Examiner*—Anh Phung
*Attorney, Agent, or Firm*—Sughrue, Mion, Zinn Macpeak & Seas, PLLC

[57] ABSTRACT

A semiconductor memory device having a column redundancy circuit is operated normally even if the number of bits used for inputting and outputting is great. The semiconductor memory device is composed of memory-cell columns each having two or more memory cells, a redundancy memory-cell column, input-output lines, switches mounted so as to correspond to the input-output lines and adapted to connect, in response to a control voltage, either of memory-cell columns adjacent to each other to the corresponding input-output line, fuses which are connected in series and to one terminal of which a supply voltage Vcc is applied and the other terminal of which is held at a ground potential GND and wherein a voltage at a point of connection between these fuses is supplied, as a control voltage, to the switches, and control voltage holding circuits which hold the control voltage applied to the switch at a "high" or "low".

17 Claims, 5 Drawing Sheets

30
42;NMOS
GND
41;inverter

51;inverter
31
$V_{CC}$
52;PMOS 62
61;control voltage holding circuit
63;inverter

SEMICONDUCTOR MEMORY DEVICE

BACKGROUND OF THE INVENTION

1. Field of the Invention

The present invention relates to a semiconductor memory device used as a SRAM, DRAM, PROM, EPROM, EEPROM and the like and more particularly to a semiconductor memory device having redundancy memory cells provided in the direction of a column.

2. Description of the Related Art

Memory capacity of a semiconductor memory device tends to grow year by year. Accordingly, a chip area is increasing and, at the same time, a pattern is being scaled down further. As a result, it is becoming difficult to completely curb the occurrence of defective memory cells which cannot write or read data exactly or normally in one semiconductor memory device. To solve this, by mounting excessive memory cells (i.e., redundancy memory cells) that can provide additional memory capacity than required and by replacing defective memory cells with these redundancy memory cells, a yield of the semiconductor memory device is conventionally improved. When the number of bits used for inputting/outputting in one semiconductor memory cell was only 4 to 16, the use of the redundancy memory cells mounted in the direction of a row in the semiconductor memory device and adapted to replace defective memory cells with these redundancy memory cells on the same word line was mainstream to imporve the yield.

However, in recent years, the number of bits tends to increase and it has now become as large as 32 to 64. Additionally, some gate arrays and system-on-chips with the semiconductor memory device of this kind built-in are operated using the number of bits being 256 for inputting/outputting. Due to increased numbers of bits used for inputting/outputting in semiconductor memory cells, gate arrays or the like, fraction defective in memory cells disposed in the row direction, sense amplifiers, read/write buffers, etc., is becoming large. Accordingly, it is difficult to prevent the drop in the yield of semiconductor memory cells only by mounting the redundancy memory cell in the direction of the row.

To solve this problem, a semiconductor memory device having redundancy memory cells mounted in the direction of a column has recently been developed as disclosed, for example, in Japanese Laid-open Patent Application No. Hei 7-122096. FIG. 6 is a diagram showing a concept of electrical configurations of important features of a conventional semiconductor memory device disclosed in the above application. This semiconductor memory device, as shown in FIG. 6, is provided with "n" pieces of memory-cell columns $1_1$ to $1_n$, each having two or more memory cells. Of these memory-cell columns, the column $1_n$ is a redundancy memory-cell column. Each of the memory-cell columns $1_1$ to $1_n$ is connected to input-output nodes $2_1$ to $2_n$ through each of corresponding bit lines. Between the input-output nodes $2_1$ to $2_n$ adjacent to each other are placed "(n−1)" pieces of switches $3_1$ to $3_{n-1}$. A terminal Ta of each of these switches $3_1$ to $3_{n-1}$ is connected to a left side of each of input-output nodes 2 as shown in the drawing. A terminal Tb of each switch 3 is connected to a right side of each of input-output nodes $2_1$ to $2_n$ as shown in the drawing and a terminal Tc of the switch 3 is connected to each of corresponding input-output lines $4_1$ to $4_{n-1}$. Though not shown, more than one word line is mounted in the direction of a row to connect each of memory-cell columns $1_1$ to $1_n$. When one of these word lines is activated, a desired memory cell is selected to allow reading and/or writing. Moreover, between the memory-cell columns $1_1$ to $1_n$ and input-output nodes $2_1$ to $2_n$ are mounted circuits, including a sense amplifier, column selecting circuit, read/write buffer and the like, required to make the memory cell read or write data.

FIG. 7 is a circuit diagram of a switch constituting the conventional semiconductor memory device. As depicted in FIG. 7, the switch 3 is composed of transfer NMOS transistors (hereinafter referred to as transistors) 11 and 12, transfer PMOS transistors (hereinafter referred to as transistors) 13 and 14 and an inverter 15. When a "high" level control voltage is applied to the terminal Td of the switch 3, the transfer NMOS 11 is turned on and the transfer PMOS 14 is turned off. At this point, since an output voltage of the inverter 15 goes "high", the transfer NMOS 12 is turned off and the transfer PMOS 13 is turned on. This causes the terminal Tc to be connected to the terminal Ta. On the other hand, when a "low" level control voltage is applied to the terminal Td of the switch 3, the transfer NMOS 11 is turned off and the transfer PMOS 14 is turned on. At this point, since an output voltage of the inverter 15 goes "high", the transfer NMOS 12 is turned on and the transfer PMOS 13 is turned off. This causes the terminal Tc to be connected to the terminal Tb. Then, the switch 3 is connected to the input-output line 4 corresponding to either of the input-output nodes 2 selected.

In FIG. 6, assuming that any one of memory cells constituting the memory-cell column $1_4$ is a defective memory cell (the memory-cell column containing defective memory cells is referred hereinafter to as a defective memory-cell column), a fuse $5_4$ is turned off and the terminal Tc of all switches $3_1$ to $3_3$ disposed on the left side of the memory-cell column $1_4$ is connected to the terminal Ta and the switching is made so that the switch can be connected to input-output nodes $2_1$ to $2_3$ disposed on the left side of these switches and, at the same time, the terminal Tc of all switches $3_4$ to $3_{n-1}$ disposed on the right side of the memory-cell column $1_4$ is connected to the terminal Tb and the switching is made so that the switch can be connected to input-output nodes $2_4$ to $2_{n-1}$ disposed on the right side of these switches.

Referring to FIG. 6, to set the switching direction of the switch 3, "n" pieces of fuses $5_1$ to $5_n$ are connected in series. To one end of these fuses is applied a supply voltage Vcc and the other end of the same is connected to a position of ground GND through a resistor 6. Each point of connection between fuses 5 adjacent to each other is connected to the terminal Td of each of the switches 3 and a voltage at the point of connection is applied, as a control voltage, to each of the corresponding switches 3.

In the examination of the quality of the semiconductor memory device to see if it is defective or not, when any one (for example, fuse $5_4$ in FIG. 6) of the fuses 5 corresponding to the position of any defective memory-cell column (i.e., memory-cell column $1_4$ in FIG. 6) is shut off by a laser or the like, the voltage at a point of connection on the side of the power source Vcc with respect to any shut-off fuse 5 is set to go "high" and the voltage at a point of connection on the side of the position of the ground GND with respect to the shut-off fuse 5 is set to go "low", thus allowing the switching direction of the switch 3 to be set in a fixed manner.

In the above conventional semiconductor memory device, if, because the memory-cell column $1_1$ is the defective memory-cell column, the fuse $5_1$, not the fuse $5_4$, is shut off (see FIG. 6), all the control voltages go "low" and, in all switches $3_1$ to $3_{n-1}$, the transfer NMOS 12 and transfer PMOS 14 are turned on and, at the same time, the transfer NMOS 11 and transfer PMOS are turned off, causing the terminal Tc to be connected to the terminal Tb. In this case, the terminal Td of the switch 3 disposed near to the position of the ground GND (for example, switches $3_{n-1}$ or $3_{n-2}$) is easily held at a ground potential. However, the terminal Td of the switch 3 disposed far from the position of the ground GND (for example, the switch $3_1$) is hardly held at the ground potential and is driven in a state of easily picking up noises occurring in the surrounding atmosphere because of resistance and capacitance of fuses $5_2$ to $5_n$ connected between the switch and the position of the ground GND and of the wiring installed to connect these fuses therewith.

In this state, if, for example, a level of a potential of data supplied to the input-output line $4_1$ is reversed from a "low" to a "high" for the data to be written in a memory-cell column $1_2$, a gate and drain of the transfer NMOS 11 are coupled respectively to a gate and drain of the transfer NMOS 12 owing to floating capacitance $C_{NGD}$ between the gates and the drains of the transfer NMOSs 11 and 12 (see FIG. 7), while a gate and source of the transfer PMOS 13 are coupled respectively to a gate and source of the transfer PMOS 14 owing to floating capacitance $C_{PGS}$ between the gates and the sources of the transfer PMOSs 13 and 14 (see FIG. 7) and, as a result, the gate voltage of each transistor may be changed instantaneously from a "low" to a "high" (this is called "coupling noise"). Because of this, there are some cases where the transfer NMOS 12 and transfer PMOS 14 become in the OFF state though it should be originally in the ON state, while the transfer NMOS 11 and transfer PMOS 13 become in the ON state though it should be originally in the OFF state. Then, if the terminal Ta of the switch $3_1$ is once connected to the terminal Ta, data is erroneously written in the defective memory-cell column $1_1$ to which data should not be originally written.

On the other hand, for example, if the fuse $5_n$, not the fuse $5_4$, is shut off because the memory-cell column $1_n$ is defective and the memory-cell columns $1_1$ to $1_{n-1}$ is normal, all the control voltages go "high" and, as a result, in all the switches $3_1$ to $3_{n-1}$, the transfer NMOS 11 and transfer PMOS 13 are turned on and, at the same time, the transfer NMOS 12 and the transfer PMOS 14 are turned off, causing the terminal Tc to be connected to the terminal Ta. In this case, the terminal Td of the switch 3 disposed near to the power source Vcc (for example, switches $3_1$ or $3_2$) is easily held at the supply voltage Vcc. However, the terminal Td of the switch 3 disposed far from the power source (for example, the switch $3_{n-1}$) is hardly held at the supply voltage Vcc and is driven in a state of easily picking up noises occurring in the surrounding atmosphere because of the resistance and capacitance of fuses $5_1$ to $5_n$ connected between the switch 3 and the power source and of the wiring installed to connect these fuses therewith. In this state, if, for example, a level of a potential of data supplied to the input-output line $4_{n-1}$ is reversed from a "low" to a "high" for the data to be written data in a memory-cell column $1_{n-1}$, a gate and drain of the transfer NMOS 11 are coupled respectively to a gate and drain of the transfer NMOS 12 owing to floating capacitance $C_{NGD}$ (see FIG. 7), while a gate and source of the transfer PMOS 13 are coupled respectively to a gate and source of the transfer PMOS 14 owing to floating capacitance $C_{PGS}$ and, as a result, the coupling noise occurs, causing the gate voltage of each of the transfer NMOSs and the transfer PMOSs to be changed instantaneously from a "low" to a "high" in some cases. Because of this, there are some cases where the transfer NMOS 12 and transfer PMOS 14 become in the ON state though it should be originally in the OFF state, while the transfer NMOS 11 and transfer PMOS 13 become in the OFF state though it should be originally in the ON state. Then, if the terminal Ta of the switch $3_{n-1}$ is once connected to the terminal Ta, data is erroneously written in the defective memory-cell column $1_n$ to which data should not be originally written.

Due to malfunctions described above, data stored by this semiconductor memory device may be different from that originally stored, causing a malfunction of equipment employing this semiconductor memory device.

Similar malfunctions as described above may occur when data is read out. That is, when data read out from the memory cell is passed through the corresponding switch 3, if a level of a potential of the data is reversed from a "low" to a "high" or vice versa, due to floating capacitance $C_{NGS}$ between the gates and sources of the transfer NMOSs 11 and 12 and floating capacitance $C_{PGD}$ between the gates and drains of the transfer PMOSs 13 and 14 (see FIG. 7), the gate voltages of the transfer NMOSs 11 and 12 and the transfer PMOSs 13 and 14 are changed instantaneously from a "high" to a "low" or vice versa, thus causing the terminal Tc of the switch 3 to be connected to a terminal that should not be connected originally. As a result, the read-out data may contain values being shifted by one bit, causing malfunctions of equipment employing this semiconductor memory device. Moreover, if the malfunction described above had occurred at the time of writing data, the value of read data may be entirely different from that of data which should have been stored initially and the malfunction of the equipment using this semiconductor memory device is inevitable.

SUMMARY OF THE INVENTION

In view of the above, it is an object of the present invention to provide a semiconductor memory device capable of writing and reading exact values of data without malfunctions, even if the number of bits used for inputting and outputting is great.

According to a first aspect of the present invention, there is provided a semiconductor memory device comprising:

multiple memory-cell columns each having two or more memory cells;

input-output lines the number of which is smaller than that of the memory-cell columns;

switches mounted so as to correspond to the input-output lines and to connect, in response to a control voltage, either of the memory-cell columns adjacent to each other to corresponding input-output lines;

more than one defective-position setting means connected in series, one terminal of which is held at a "high" level potential and the other terminal of which is held at a "high" or "low" level potential, and wherein a voltage of a point of connection between these means is applied, as the control voltage, to two or more switches; and at least one control voltage holding circuit to hold the control voltage supplied to two or more switches at a "high" or "low" level.

According to a second aspect of the present invention, there is provided a semiconductor memory device comprising:

two or more memory-cell column groups each having more than one memory-cell column consisting of two or more memory cells;

column selecting circuits to select, in response to a column address signal, any one of the memory-cell column groups;

input-output lines the number of which is smaller than that of the column selecting circuit;

two or more switches mounted so as to correspond to the input-output lines and to connect, in response to a control voltage, either of the column selecting circuits adjacent to each other to corresponding input-output lines;

more than one defective-position setting means connected in series, one terminal of which is held at a "high" level potential and the other terminal of which is held at a "low" level potential, and wherein a voltage of a point of connection between these means is supplied, as the control voltage, to said two or more switches; and two or more register columns to turn off any one of two or more defective-position setting means, to store more than one setting signal to cause remaining other defective-position setting means to be turned on and to select and output any one of setting signals in response to the column address signal; and at least one control voltage holding circuit to hold the control voltage supplied to two or more switches at a "high" or "low" level.

In the foregoing, a preferable mode is one wherein the control voltage holding circuit comprises a first control voltage holding circuit to hold, in accordance with shut-off states of the defective-position setting means disposed in the vicinity of the control voltage holding circuit, the control voltage supplied to the switches to a "high" or "low" level and wherein the control voltage holding circuit is provided for each said point of connection, for every other point of connection or for every predetermined numbers of the point of connection.

Also, a preferable mode is one wherein the control voltage holding circuit comprises a second control voltage holding circuit to hold the control voltage supplied to the switches at a "high" level and a third control voltage holding circuit to hold the control voltage supplied to the switches at a "low" level, and wherein the second control voltage holding circuit is provided for each point of connection, for every other point of connection or for every predetermined numbers of the point of connection disposed between one end of the line to which the point of connection is coupled and approximate center position of the line, or in the vicinity of the last one of points of connection constituting one third of the total points of connection counted from one end of said line to which the point of connection is coupled, and wherein the third control voltage holding circuit is provided for each point of connection, for every other point of connection or for every predetermined numbers of point of connection disposed between the other end of the line to which the point of connection is coupled and approximate center position of the line, or in the vicinity of the last one of points of connection constituting one third of the total points of connection counted from the other end of the line to which said point of connection is coupled.

Also, a preferable mode is one wherein the first control voltage holding circuit is disposed at a center of the line to which the point of connection is coupled.

Also, a preferable mode is one wherein the first control voltage holding circuit comprises a first inverter the output terminal of which is connected to a corresponding point of connection and a second inverter the input terminal of which is connected to an output terminal of the first inverter and the output terminal of which is connected to an input terminal of said first inverter.

Also, a preferable mode is one wherein the second control voltage holding circuit comprises an n-channel MOS transistor the drain of which is connected to a corresponding point of connection and the source voltage of which is held "low" and an inverter the input terminal of which is connected to the drain and the output terminal of which is connected to a gate of the n-channel MOS transistor.

Also, a preferable mode is one wherein the third control voltage holding circuit comprises a p-channel MOS transistor the drain of which is connected to a corresponding point of connection and the source voltage of which is held "high" and an inverter the input terminal of which is connected to the drain and the output terminal of which is connected to a gate of the p-channel MOS transistor.

It is preferable that the defective-position setting means is composed of fuses.

Also, it is preferable that the defective-position setting means is composed of transistors or transfer gates.

A preferable mode is one wherein the semiconductor memory device comprises a fuse one terminal of which is held at a "high" level potential, a resistor one terminal of which is connected to the fuse and the other terminal of which is held at a "low" level potential, a voltage holding circuit composed of at least one n-channel MOS transistor and of a buffer the input terminal of which is connected to a point of connection between the fuse and the resistor and the other terminal of which is connected to the other terminal of two or more defective-position setting means connected in series and wherein the potential of other terminal of two or more defective-position setting means connected in series is held "high" or "low" by said voltage holding circuit.

Also, a preferable mode is one wherein the voltage holding circuit has a flip-flop composed of at least two inverters, instead of said buffer.

Furthermore, a preferable mode is one wherein the inverter comprises an n-channel MOS transistor and p-channel MOS transistor and when SN represents the size of said n-channel MOS transistor constituting the buffer or an n-channel MOS transistor constituting an inverter of the flip-flop, Sp representing the size of a p-channel MOS constituting a first inverter of the first control voltage holding circuit or constituting the third control voltage holding circuit and k representing the number of the first and third control voltage holding circuit, the following formula (1) is satisfied:

$$2 \cdot SN \geq kSp \tag{1}$$

BRIEF DESCRIPTION OF THE DRAWING

The above and other objects, advantages and features of the present invention will be more apparent from the following description taken in conjunction with the accompanying drawings, in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
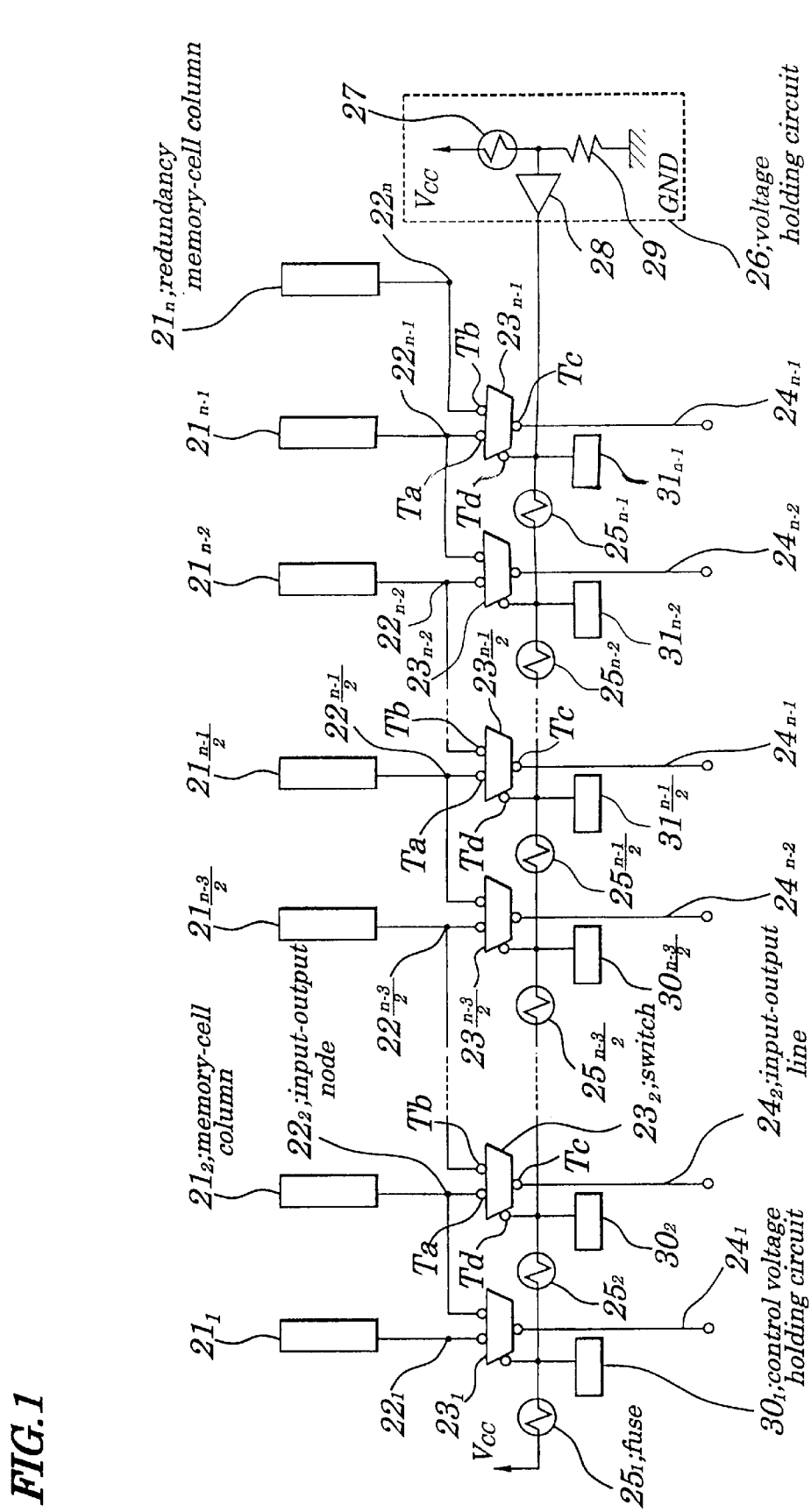
FIG. 1 is a block diagram showing electrical configurations of important features of the semiconductor memory device according to a first embodiment of the present invention.

FIG. 1 is a block diagram showing electrical configurations of important features of a semiconductor memory device according to a first embodiment of the present invention.

As depicted in FIG. 1, the semiconductor memory device is provided with "n" pieces of memory-cell columns $21_1$ to $21_n$ each having two or more memory cells and being connected to each of corresponding input-output nodes $22_1$ to $22_n$ via bit lines; the memory-cell column $21_n$ being a redundancy memory-cell column. It is also provided with "(n-1)" pieces of switches $23_1$ to $23_{n-1}$, each terminal Ta of these switches 23 being connected to the input-output nodes 22 disposed above the terminal as shown in FIG. 1; each terminal Tb of these switches being connected to a right side of each of the input-output notes 22 as shown in FIG. 1 and each terminal Tc of these switches 23 being connected to each of corresponding input-output lines $24_1$ to $24_{n-1}$. Electrical configurations and operations of these switches 23 are the same as those of the switches 3 in FIG. 6 and descriptions of them are omitted accordingly.

Moreover, the semiconductor memory device is provided with "(n-1)" pieces of fuses $25_1$ to $25_{n-1}$, which are all connected in series and to one terminal of which a supply voltage Vcc is applied and the other terminal of which is connected to a voltage holding circuit 26. A point of connection between these fuses 25 being adjacent to each other is connected to each terminal Td of the switches 23 and a voltage at the point of connection between these fuses 25 being adjacent to each other is applied to the corresponding switches 23 as a control voltage. The voltage holding circuit 26 is adapted to hold the other terminal of the fuse $25_{n-1}$ at the supply voltage Vcc or a ground potential GND, which is composed of a fuse 27, a buffer 28 and a resistor 29. To one terminal of the fuse 27 is applied a supply voltage Vcc and the other terminal of the fuse is connected to the position of the ground GND through the resistor 29. An input terminal of the buffer 28 is connected to a point of connection between the fuse 27 and the resistor 29 and an output terminal of the buffer 28 is connected to the other terminal of the fuse $25_{n-1}$. The voltage holding circuit 26 is so operated that it holds the other terminal of the fuse $25_{n-1}$ at the supply voltage Vcc while the fuse remains in the ON state and at the ground potential GND while the fuse is in the OFF state. The buffer 28 serves to hold the voltage of the other terminal of the fuse $25_{n-1}$ at a high level when the power is applied to the semiconductor memory device while all the fuses $25_1$ to $25_{n-1}$ and the fuse 27 are in the ON state regardless of the length of time required for the power to reach a predetermined voltage, and to put the semiconductor memory_device into the test mode when any defective memory cell is detected.

Moreover, each of the terminal Td of the switches from $23_1$ to $23_{(n-3)/2}$ is connected respectively to each of control voltage holding circuits $30_1$ to $30_{(n-3)/2}$ and each of the terminal Td of the switches from $23_{(n-1)/2}$ to $23_{(n-1)}$ is connected respectively to each of control voltage holding circuits $31_{(n-1)/2}$ to $31_{(n-1)}$.

Figure 2:
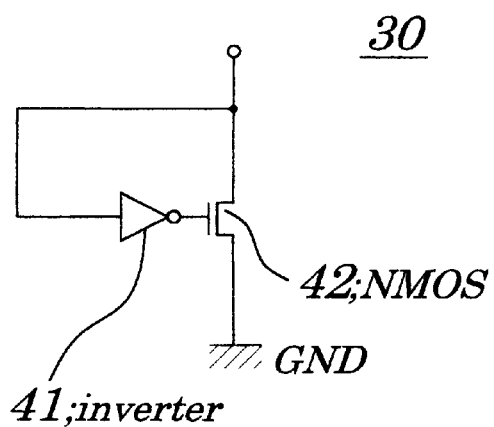
FIG. 2 is a circuit diagram showing electrical configurations of a control voltage holding circuit constituting the semiconductor memory device.

FIG. 2 is a circuit diagram showing electrical configurations of the control voltage holding circuit 30.

The control voltage holding circuit 30 is composed of an inverter 41 and a NMOS 42. An input terminal of the inverter 41 is connected to the NMOS 42 and a point of connection between these is connected to the terminal Td of the corresponding switch_23. Also, an output terminal of the inverter 41 is connected to the NMOS 42 and a source of the NMOS is grounded.

Figure 3:
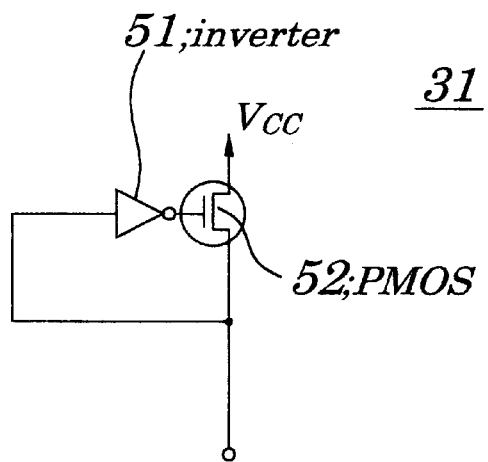
FIG. 3 is also a circuit diagram showing electrical configurations of a control voltage holding circuit constituting the semiconductor memory device.

Furthermore, FIG. 3 is a circuit diagram showing electrical configurations of the control voltage holding circuit 31. The control voltage holding circuit 31 consists of an inverter 51 and a PMOS 52. An input terminal of the inverter 51 is connected to a drain of the PMOS and a point of connection between these is connected to the terminal Td of the corresponding switch 23. An output terminal of the inverter 51 is connected to a gate of the PMOS 52 and to a source of the PMOS is applied the supply voltage Vcc.

In the examination of the quality of the semiconductor memory device to see if it is defective or not, when any one of the fuses 25 corresponding to the position of any defective memory-cell column 21 is shut off by a laser or the like, the voltage at a point of connection on the side of the power source Vcc with respect to any shut-off fuse 25 is set to go "high" and the voltage at a point of connection on the side of the position of the ground GND with respect to the shut-off fuse 25 is set to go "low", thus allowing switching direction of the switch 23 to set in a fixed manner.

Operations of the semiconductor memory device having such configurations as shown above are hereinafter described. If the fuses $25_1$ and 27 are turned off due to a defective memory-cell column $21_1$, because all the control voltages go "low", both a transfer NMOS 12 and transfer PMOSs 14 within all the switches $23_1$ to $23_{n-1}$ are turned on while a transfer NMOSs 11 and transfer PMOSs 13 within he same are turned off, causing the terminal Tc to be connected to Td (see FIGS. 7 and 8). In this case, even in the switch 23 disposed far from the position of the ground GND such as the switch $23_1$, an output voltage of the inverter goes "high" owing to a "low" level control voltage fed by the control voltage holding circuit 30 provided therein, thus causing the NMOS 42 to be turned on (see FIG. 2). This also causes the control voltage applied to the terminal Td of the switch $23_1$ to be held at a ground potential GND.

Even if fuses $25_2$ to $25_{n-1}$ are connected between the terminal Td of the switch $23_1$ and the buffer 28, or wirings are mounted to connect these fuses to each other and, as a result, the resistance of the fuses $25_2$ to $25_{n-1}$ or of the wiring exists, the semiconductor memory device is resistant to noise caused by changes in potentials of the input-output lines 24.

Figure 7:
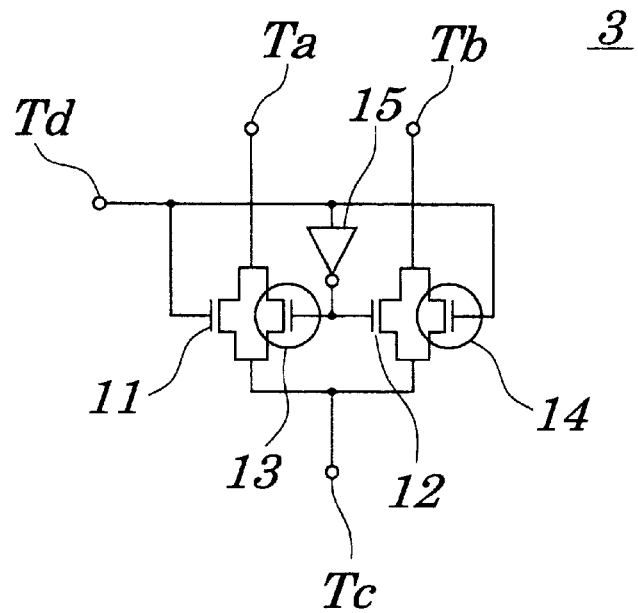
FIG. 7 is a circuit diagram of a switch constituting the conventional semiconductor memory device.

In this state, if, for example, a level of a potential of data applied to the input-output line $24_1$ is reversed from a "low" to a high for the data to be written in a memory-cell column $21_2$, a gate and drain of the transfer NMOS 11 are coupled respectively to a gate and drain of the transfer NMOS 12 owing to floating capacitance $C_{NGD}$ of the transfer NMOSs 11 and 12 (see FIG. 7), while a gate and source of the transfer PMOS 13 are coupled respectively to a gate and source of the transfer PMOS 14 owing to floating capacitance $C_{PGS}$ (see FIG. 7). At this point, though coupling noise is apt to occur responding to the reversion of a potential of data from a "low" to a "high", because control voltage holding circuits 30 are provided to hold the terminal Td of the switch $23_1$ at the ground potential GND, the coupling noise can be reduced. This does not cause the ON/OFF states of the transfer NMOSs 11 and 12 and of the PMOSs 13 and 14 to be changed. Accordingly, exact data are written in the memory-cell column $21_2$ and exact values of data are stored in the semiconductor memory device.

Figure 8:
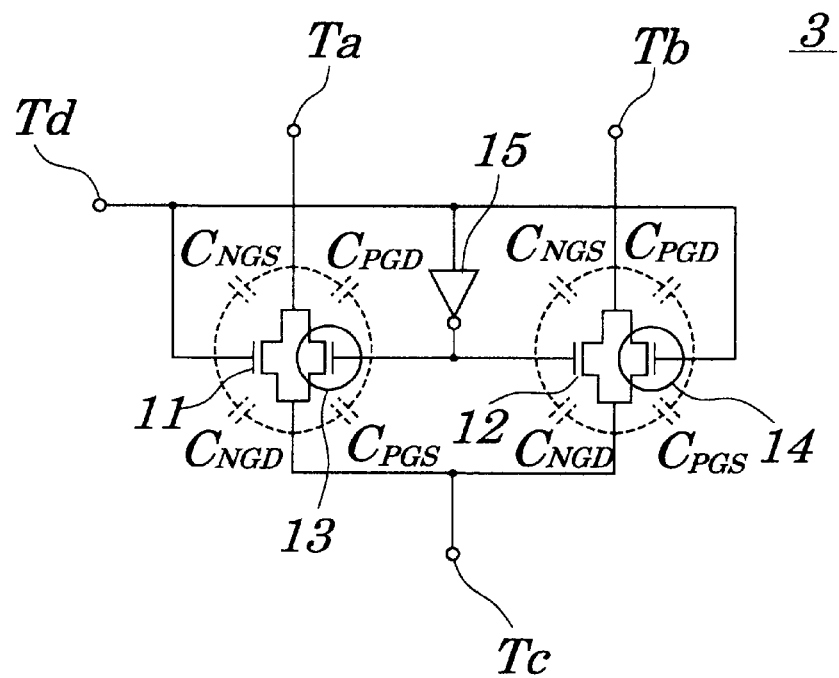
FIG. 8 is a circuit diagram to describe shortcomings of the conventional memory device.

On the other hand, if, for example, a level of a potential of data which have reached the input-output node $22_1$ is reversed from a "low" to a "high" to read out data already written in the memory-cell column $21_2$, a gate and source of the transfer NMOS 11 are coupled to a gate and source of the transfer NMOS 12 owing to floating capacitance $C_{NGS}$ of the transfer NMOSs 11 and 12 (see FIG. 8), while a gate of the transfer PMOS 13 is coupled to a drain of the transfer PMOS 14 owing to floating capacitance $C_{PGD}$ (see FIG. 8). At this point, though the coupling noise is apt to occur responding to the reversion of the potential of data from a "low" to a "high", because control voltage holding circuits 30 are provided to hold the terminal Td of the switch $23_1$ at the ground potential, the coupling noise can be reduced. This does not cause the ON/OFF states of the transfer NMOSs 11 and 12 and of the PMOSs 13 and 14 to be changed as well. Accordingly, exact data are read out from the memory-cell column $21_2$ and exact values of data are read out from the semiconductor memory device.

Figure 6:
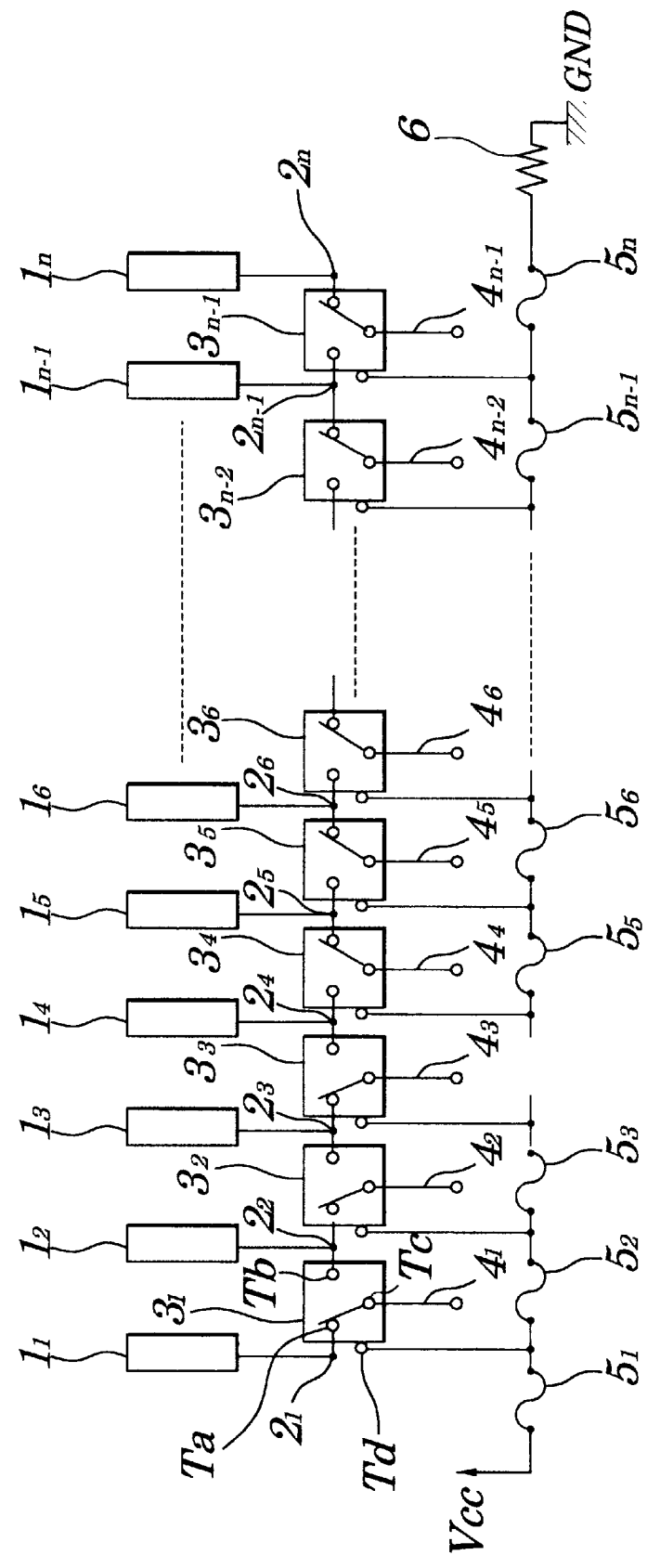
FIG. 6 is a diagram showing a concept of electrical configurations of important features of a conventional semiconductor memory device.

If the fuses $25_{n-1}$ and 27 are turned off due to the defective memory-cell column $21_{n-1}$, because all the control voltages other than those applied to the terminal Td of the switch $23_{n-1}$ go "high", both a transfer NMOS 11 and transfer PMOS 13 within all the switches $23_1$ to $23_{n-1}$ are turned on while a transfer NMOS 12 and transfer PMOS 14 within the same are turned off, causing the terminal Tc to be connected to Ta (see FIG. 6). On the other hand, in the switch $23_{n-1}$, because the control voltage goes "low", the transfer NMOS 12 and the transfer PMOS 14 are turned on and the transfer NMOS 11 and the transfer PMOS 13 are turned off, causing the terminal Tc to be connected to the terminal Tb (see FIG. 6).

In this case, even in the switch 23 disposed far from the power source Vcc such as the switch $23_{n-1}$, an output voltage of the inverter goes "high" owing to a "high" level control voltage fed by the control voltage holding circuit 31 provided therein, thus causing an output voltage of the inverter 51 to go "low" and the PMOS to be turned on (see FIG. 3). This also causes the control voltage applied to the terminal Td of the switch $23_{n-2}$ to be held at the supply voltage Vcc.

Even if fuses $25_1$ to $25_{n-2}$ are connected between the terminal Td of the switch $23_{n-1}$ and the power source Vcc, or wirings are mounted to connect these fuses to each other and, as a result, the resistance of the fuses $25_1$ to $25_{n-2}$ or of the wiring exists, the semiconductor memory device is resistant to the noise caused by changes in potentials of the input-output lines 24.

In this state, if, for example, a level of a potential of data applied to the input-output line $24_{n-2}$ is reversed from a "high" to a "low" for the date to be written in a memory-cell column $21_{n-2}$, the gate and drain of the transfer NMOS 11 are coupled respectively to the gate and drain of the transfer NMOS 12 owing to floating capacitance $C_{NGD}$ of the transfer NMOSs 11 and 12 (see FIG. 8), while the gate and source of the transfer PMOS 13 are coupled respectively to the gate and source of the transfer PMOS 14 owing to floating capacitance $C_{PGS}$ (see FIG. 8). At this point, though the coupling noise is apt to occur responding to the reversion of the potential of data from a "high" to a "low", because control voltage holding circuits 31 are provided to hold the terminal Td of the switch $23_{n-1}$ at the supply voltage Vcc, the coupling noise can be reduced. This does not cause the ON/OFF states of the transfer NMOSs 11 and 12 and of the PMOSs 13 and 14 to be changed as well. Accordingly, exact data are written in the memory-cell column $21_{n-2}$ and exact values of data are stored in the semiconductor memory device.

On the other hand, if, for example, a level of a potential of data which have reached the input-output node $22_{n-2}$ is reversed from a "high" to a "low" to read out data already written in the memory-cell column $21_{n-2}$, the gate and source of the transfer NMOS 11 are coupled respectively to a gate and source of the transfer NMOS 12 owing to floating capacitance $C_{NGS}$ of the transfer NMOSs 11 and 12 (see FIG. 8), while the gate and drain of the transfer PMOS 13 are coupled respectively to the gate and drain of the transfer PMOS 14 owing to floating capacitance $C_{PGD}$ (see FIG. 8). At this point, though the coupling noise is apt to occur responding to the reversion of the potential of data from a "high" to a "low", because control voltage holding circuits 31 are provided to hold the terminal Td of the switch $23_{n-2}$ at the ground potential, the coupling noise can be reduced. This does not cause the ON/OFF states of the transfer NMOSs 11 and 12 and of the PMOSs 13 and 14 to be changed. Accordingly, exact data are read out from the memory-cell column $21_{n-2}$ and exact values of data are read out from the semiconductor memory device.

Thus, according to the first embodiment, since the control voltage holding circuit 30 is provided to hold the voltage at each terminal Td of switches $23_1$ to $23_{(n-1)/2}$ at the ground potential, when the fuse 25 disposed near to the position of the supply voltage Vcc is turned off, coupling noise can be reduced while data are written into the memory-cell column 21 connected to the switch 23 disposed far from the position of the ground GND. By this, a malfunction can be prevented when data are written/read.

Also, according to the first embodiment, since the control voltage holding circuit 31 is provided to hold the voltage at each terminal Td of switches $23_{(n+1)}$ to $23_{(n-1)}$ at the ground potential, when the fuse 25 disposed near to the position of the ground GND is turned off, the coupling noise can be reduced while data are written into the memory-cell column 21 connected to the switch 23 disposed far from the power source Vcc. By this, a malfunction can be prevented when data are written/read.

Because, the larger the number of bits used in the semiconductor memory device is, the more the number of the fuse connected in series is required and the greater the distance from the switch 23 placed in the vicinity of the turned-off fuses to the position of the ground GND or of the supply voltage Vcc becomes, the merit of the reduction in the coupling noise according to this embodiment is increased accordingly.

Second Embodiment

Figure 4:
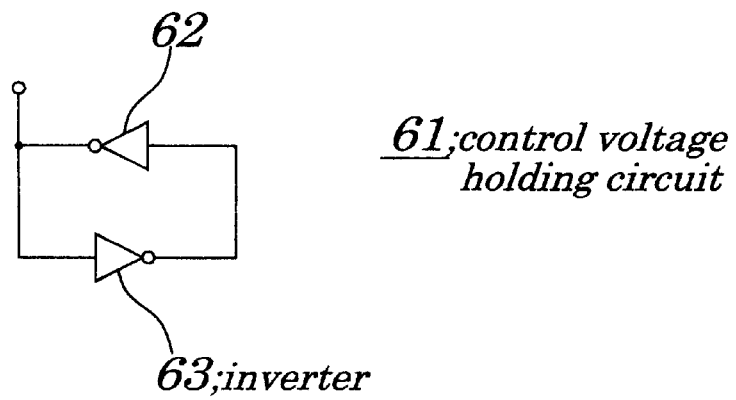
FIG. 4 is a circuit diagram showing electrical configurations of a control voltage holding circuit constituting a semiconductor memory device according to a second embodiment of the present invention.

FIG. 4 is a circuit diagram showing electrical configurations of a control voltage holding circuit 61 constituting the semiconductor memory device according to a second embodiment of the present invention. In the second embodiment, as the important features of the semiconductor memory device are the same as those shown in FIG. 1 except that it is provided with control voltage holding circuits $61_1$ to $61_{n-1}$ instead of the control voltage holding circuits $30_1$ to $30_{(n-1)/2}$, their detailed description is omitted. As shown in FIG. 4, the control voltage holding circuit 61 is composed of two inverters 62 and 63. An output terminal of the inverter 62 is connected to the input terminal of the inverter 63 and a point of connection between these inverters is connected to the terminal Td of the switch 23. Moreover, an input terminal of the inverter 62 is connected to an output of the inverter 63.

Operations of the semiconductor memory device having the above configurations are described hereafter. If the fuses $25_1$ and 27 are turned off due to a defective memory-cell column $21_1$, because all the control voltages go "low", both the transfer NMOS 12 and transfer PMOS 14 within all the switches $23_1$ to $23_{n-1}$ are turned on while the transfer NMOS 11 and transfer PMOS 13 within the same are turned off, causing the terminal Tc to be connected to Tb (see FIG. 6).

In this case, even in the switch 23 disposed far from the position of the ground GND such as the switch $23_1$, an output voltage of the inverter 63 goes "high" owing to a "low" level control voltage fed by the control voltage holding circuit 61 provided therein, thus causing the output voltage of the inverter 62 to go "low" (see FIG. 4). This also causes the control voltage applied to the terminal Td of the switch $23_1$ to be held at a ground potential.

Even if fuses $25_2$ to $25_{n-1}$ are connected between the terminal Td of the switch $23_1$ and the buffer 28, or wirings are mounted to connect these fuses to each other and, as a result, the resistance of the fuses $25_2$ to $25_{n-1}$ or of the wiring exists, the semiconductor memory device is resistant to noises caused by changes in potentials of the input-output lines 24.

In this state, if, for example, a level of a potential of data applied to the input-output line $24_1$ is reversed from a "low" to a "high" to write data in a memory-cell column $21_2$, the gate and drain of the transfer NMOS 11 are coupled respectively to the gate and drain of the transfer NMOS 12 owing to floating capacitance $C_{NGD}$ of the transfer NMOSs 11 and 12 (see FIG. 7), while the gate and source of the transfer PMOS 13 are coupled respectively to the gate and source of the transfer PMOS 14 owing to floating capacitance $C_{PGS}$ (see FIG. 8). At this point, though the coupling noise is apt to occur responding to the reversion of the potential of data from a "low" to a "high", because control voltage holding circuits 61 are provided to hold the terminal Td of the switch $23_1$ at the ground potential, the coupling noise can be reduced. This does not cause the ON/OFF states of the transfer NMOSs 11 and 12 and of the PMOSs 13 and 14 to be changed. Accordingly, exact data are written in the memory-cell column $21_2$ and exact values of data are stored in the semiconductor memory device.

On the other hand, if, for example, a level a potential of data which have reached the input-output node $22_1$ is reversed from a "low" to a "high" to read out data already written in the memory-cell column $21_2$, a gate and a source of the transfer NMOS 11 are coupled respectively to a gate and source of the transfer NMOS 12 owing to floating capacitance $C_{NGS}$ of the transfer NMOSs 11 and 12 (see FIG. 8), while a gate and drain of the transfer PMOS 13 are coupled to a gate and drain of the transfer PMOS 14 owing to floating capacitance $C_{PGD}$ (see FIG. 7). At this point, though the coupling noise is apt to occur responding to the reversion of data from a "low" to a "high", because control voltage holding circuits 30 are provided to hold the terminal Td of the switch $23_1$ at the ground potential, the coupling noise can be reduced. This does not cause the ON/OFF states of the transfer NMOSs 11 and 12 and of the PMOSs 13 and 14 to be changed. Accordingly, exact data are read out from the memory-cell column $21_2$ and exact values of data are read out from the semiconductor memory device.

If the fuses $25_{n-1}$ and 27 are turned off due to a defective memory-cell column $21_{n-1}$, because all the control voltages other than those applied to the terminal Td of the switch $23_{n-1}$ go "high", both a transfer NMOS 11 and transfer PMOSs 13 within all the switches $23_1$ to $23_{n-1}$ are turned on while a transfer NMOS 12 and transfer PMOS 14 within the same are turned off, causing the terminal Tc to be connected to Ta (see FIG. 6). On the other hand, in the switch $23_{n-1}$, because the control voltage goes "low", the transfer NMOS 12 and the transfer PMOS 14 are turned on and the transfer NMOS 11 and the transfer PMOS 13 are turned off, causing the terminal Tc to be connected to the terminal Tb (see FIG. 6).

In this case, even in the switch 23 disposed far from the power source Vcc such as the switch $23_{n-1}$, an output voltage of the inverter goes "high" owing to a "high" level control voltage fed by the control voltage holding circuit 31 provided therein, thus causing an output voltage of the inverter 51 to go "low" and the PMOS to be turned on (see FIG. 3). This also causes the control voltage applied to the terminal Td of the switch $23_{n-2}$ to be held at the supply voltage Vcc.

Even if fuses $25_1$ to $25_{n-2}$ are connected between the terminal Td of the switch $23_{n-1}$ and the power source Vcc, or wirings are mounted to connect these fuses to each other and, as a result, the resistance of the fuses $25_1$ to $25_{n-2}$ or of the wiring exists, the semiconductor memory device is resistant to noises caused by changes in potentials of the input-output lines 24.

In this state, if, for example, a level of a potential of data supplied to the input-output line $24_{n-2}$ is reversed from a "high" to a "low" to write data in a memory-cell column $21_{n-2}$, the gate and drain of the transfer NMOS 11 are coupled respectively to the gate and drain of the transfer NMOS 12 owing to floating capacitance $C_{NGD}$ of the transfer NMOSs 11 and 12 (see FIG. 7), while the gate and source of the transfer PMOS 13 are coupled respectively to the gate and source of the transfer PMOS 14 owing to floating capacitance $C_{PGS}$ (see FIG. 8). At this point, though the coupling noise is apt to occur responding to the reversion of data from a "high" to a "low", because control voltage holding circuits 31 are provided to hold the terminal Td of the switch $23_{n-1}$ at the supply voltage, the coupling noise can be reduced. This does not cause the ON/OFF states of the transfer NMOSs 11 and 12 and of the PMOSs 13 and 14 to be changed. Accordingly, exact data are written in the memory-cell column $21_{n-2}$ and exact values of data are stored in the semiconductor memory device.

On the other hand, if, for example, a level of a potential of data which have reached the input-output node $22_1$ is reversed from a "high" to a "low" to read out data already written in the memory-cell column $21_2$, the gate and source of the transfer NMOS 11 are coupled respectively to the gate and the source of the transfer NMOS 12 owing to floating capacitance $C_{NGS}$ of the transfer NMOSs 11 and 12 (see FIG. 8), while the gate and drain of the transfer PMOS 13 are coupled respectively to the gate and drain of the transfer PMOS 14 owing to floating capacitance $C_{PGD}$ (see FIG. 8). At this point, though the coupling noise is apt to occur responding to the reversion of the potential of data from a "high" to a "low", because control voltage holding circuits 61 are provided to hold the terminal Td of the switch $23_1$ at the ground potential, the coupling noise can be reduced. This does not cause the ON/OFF states of the transfer NMOSs 11 and 12 and of the PMOSs 13 and 14 to be changed. Accordingly, exact data are read out from the memory-cell column $21_2$ and exact values of data are read out from the semiconductor memory device.

If the fuses $25_{n-1}$ and 27 are turned off due to a defective memory-cell column $21_{n-1}$, because all the control voltages other than those applied to the terminal Td of the switch $23_{n-1}$ go "high", both the transfer NMOS 11 and transfer PMOSs 13 within all the switches $23_1$ to $23_{n-1}$ are turned on while the transfer NMOS 12 and transfer PMOS 14 within the same are turned off, causing the terminal Tc to be connected to Ta (see FIG. 6). On the other hand, in the switch $23_{n-1}$, because the control voltage goes "low", the transfer NMOS 12 and the transfer PMOS 14 are turned on and the transfer NMOS 11 and the transfer PMOS 13 are turned off, causing the terminal Tc to be connected to the terminal Tb (see FIG. 6).

In this case, even in the switch 23 disposed far from the power source Vcc such as the switch $23_{n-2}$, an output voltage of the inverter goes "high" owing to a "high" level control voltage fed by the control voltage holding circuit 61 provided therein, thus causing an output voltage of the inverter 63 to go "low" and the output of the inverter 62 to go "high" (see FIG. 4). This also causes the control voltage applied to the terminal Td of the switch $23_{n-2}$ to be held at the supply voltage Vcc.

Even if fuses $25_1$ to $25_{n-2}$ are connected between the terminal Td of the switch $23_{n-2}$ and the power source Vcc, or wirings are mounted to connect these fuses to each other and, as a result, the resistance of the fuses $25_1$ to $25_{n-2}$ or of the wiring exists, the semiconductor memory device is resistant to noises caused by changes in potentials of the input-output lines 24.

In this state, if, for example, a level a potential of data supplied to the input-output line $24_{n-2}$ is reversed from a "high" to a "low" to write data in a memory-cell column $21_{n-2}$, a gate and drain of the transfer NMOS 11 are coupled respectively to a gate and drain of the transfer NMOS 12 owing to floating capacitance $C_{NGD}$ of the transfer NMOSs 11 and 12 (see FIG. 8), while a gate and source of the transfer PMOS 13 are coupled respectively to a gate and source of the transfer PMOS 14 owing to floating capacitance $C_{PGS}$ (see FIG. 8). At this point, though the coupling noise is apt to occur responding to the reversion of the potential of data from a "high" to a "low", because control voltage holding circuits 61 are provided to hold the terminal Td of the switch $23_{n-2}$ at the supply voltage Vcc, the coupling noise can be reduced. This does not cause the ON/OFF states of the transfer NMOSs 11 and 12 and of the PMOSs 13 and 14 to be changed. Accordingly, exact data are written in the memory-cell column $21_{n-2}$ and exact values of data are stored in the semiconductor memory device.

On the other hand, if, for example, a level a potential of data which have reached the input-output node $22_{n-2}$ is reversed from a "high" to a "low" to read out data already written in the memory-cell column $21_{n-2}$, the gate and source of the transfer NMOS 11 are coupled respectively to the gate and the source of the transfer NMOS 12 owing to floating capacitance $C_{NGS}$ of the transfer NMOSs 11 and 12 (see FIG. 8), while the gate and drain of the transfer PMOS 13 are coupled respectively to the gate and drain of the transfer PMOS 14 owing to floating capacitance $C_{PGD}$ (see FIG. 8). At this point, though the coupling noise is apt to occur responding to the reversion of the potential of data from a "high" to a "low", because control voltage holding circuits 61 are provided to hold the terminal Td of the switch $23_{n-2}$ at the supply voltage Vcc, the coupling noise can be reduced. This does not cause the ON/OFF states of the transfer NMOSs 11 and 12 and of the PMOSs 13 and 14 to be changed. Accordingly, exact data are read out from the memory-cell column $21_{n-2}$ and exact values of data are read out from the semiconductor memory device.

Thus, according to the second embodiment, since the control voltage holding circuit 61 is provided to hold the voltage at each terminal Td of switches 23 at the ground potential or at the supply voltage Vcc, when the fuse 25 disposed near to the power source Vcc is turned off, the coupling noise can be reduced while data are written into the memory-cell column 21 connected to the switch 23 disposed far from the position of the ground GND and when the fuse 25 disposed near to the position of the ground GND is turned off, the coupling noise can be reduced while data are written into the memory-cell column 21 connected to the switch 23 disposed far from the power source Vcc. By this, a malfunction can be prevented when data are written/read. Because, the larger the number of bits used in the semiconductor memory device is, the more the number of the fuse connected in series is required and the greater the distance from the switch 23 placed in the vicinity of the turned-off fuses to the position of the ground GND or the power supply Vcc becomes, the merit of the reduction in the coupling noise according to this embodiment is increased accordingly.

Third Embodiment

Figure 5:
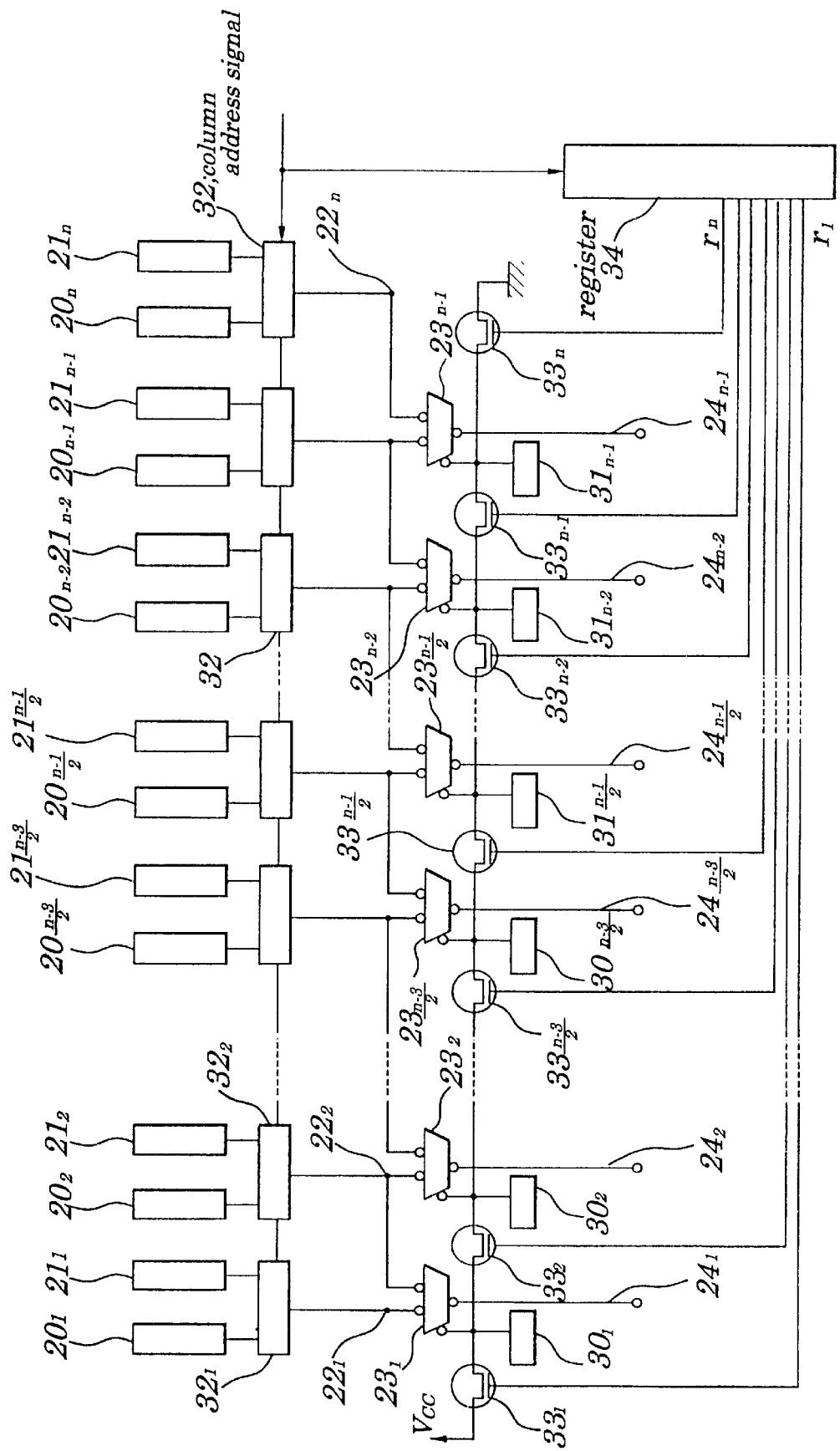
FIG. 5 is a block diagram showing electrical configurations of important features of a semiconductor memory device according to a third embodiment of the present invention.

FIG. 5 is a block diagram showing electrical configurations of important features of the semiconductor memory device according to a third embodiment of the present invention. The same reference numbers in FIG. 5 designate corresponding parts in FIG. 1 and the description of the parts is omitted. According to the third embodiment, NMOS transistors $33_1$ to $33_n$ are provided as defective-position setting means, instead of the fuses $25_1$ to $25_{n-1}$ used in FIG. 1. Each source of the NMOS transistors $33_1$ to $33_{n-1}$ is connected in series to each drain of the NMOS transistors disposed adjacent to each other. The drain of the NMOS transistor $33_1$ is connected to the power source Vcc. The source of the NMOS transistor $33_n$ is connected to a ground GND. Each gate of the NMOS transistors $33_1$ to $33_n$ is connected to a register 34.

Moreover, to input-output nodes $22_1$ to $22_n$ are connected column selecting circuits $32_1$ to $32_n$. To the column selecting circuits $32_1$ to $32_n$ are connected multiple memory-cell column group $20_1$ to $20_n$ and $21_1$ to $21_n$. The column selecting circuits $32_1$ to $32_n$ are adapted to select either the memory-cell column group $20_1$ to $20_n$ or the memory-cell column group $21_1$ to $21_n$ in response to a column address signal and to connect the selected memory-cell column group to the input-output nodes $22_1$ to $22_n$.

The register 34 prestores setting signals $r_1$ to $r_n$ to turn off any one of the transistors $33_1$ to $33_n$ and to turn on other remaining transistors. The setting signals $r_1$ to $r_n$ correspond to the register column the number of which is equivalent to that of the memory-cell column group. The register 34 selects one of the register columns in response to the column address signal and outputs the setting signal.

In this embodiment, since two memory-cell column groups are provided, two register columns are mounted and the switching can be performed by one column address signal. If, for example, four memory-cell column groups are provided per one input-output line, four register-columns may be mounted and switching may be made by two column address signals accordingly.

Operations of the semiconductor memory device having the above configurations are described hereafter. Firstly, assume that there is a defective memory cell column $20_1$ in a first memory-cell column group $20_1$ to $20_n$ and there is a defective memory cell column $21_n$ in a second memory-cell column group $21_1$ to $21_n$. In this case, signals "011 . . . 11" are stored in the first register column r11 to rn1 and signals "111 . . . 10" are stored in the second register columns r12 to rn2.

If the level of column address signal is "low" and the first memory-cell column group $20_1$ to $20_n$ is selected, the register 34 reads out the signals "011 . . . 11" as the setting signal from the first register columns r11 to rn1 and feeds them to a gate of each of the transistors $33_1$ to $33_n$. This causes the transistor $33_1$ to be off and transistors $33_2$ to $33_n$ to be turned on and, as a result, all the control voltages go "low". Since the subsequent operations are the same as those in the first embodiment, their description is omitted.

If the level of the column address signal is "high" and the second memory-cell column group $21_1$ to $21_n$ is selected, the register 34 reads out the signals "111 . . . 10" as the setting signal from the second register columns r12 to rn2 and feeds them to the gate of each of transistors $33_1$ to $33_n$. This causes the transistor $33_n$ to be on and transistors $33_1$ to $33_{n-1}$ to be turned off and, as a result, all the control voltages go "high". Since the subsequent operations are the same as those in the first embodiment, their description is omitted.

Thus, by providing transistors as the defective-position setting means, instead of fuses employed in the first embodiment, the same effects as in the first embodiment can be obtained. Moreover, since the direction of switching of the switch can be set flexibly, a redundancy circuit can be constructed by using only one set of the switches $23_1$ to $23_{n-1}$ to cover two or more memory-cell column groups, allowing the reduction of a chip area of the semiconductor memory device as well as the reduction of the fraction defective, i.e., the maximum use of non-defective memory-cell columns other than defective one or ones occurred in one semiconductor memory device. Furthermore, since voltage holding circuits 30 and 31 are mounted at predetermined positions in the same manner as in the first embodiment, even if external noise is superimposed on the control voltage, the switches 23 are not be switched from the set direction, thus preventing erroneous writing of data to be stored or erroneous reading of stored data. This can implement the semiconductor memory device having improved reliability in terms of writing and reading data.

In this embodiment, the NMOS transistors are used as the transistors $33_1$ to $33_n$, however, PMOS transistors may be used by appropriately setting a logical level of a potential to be supplied to the gate, or a transfer gate may be employed as well. Also, as in the second embodiment, the grounding position or types of switches as well as the voltage holding circuit 61 can be changed appropriately so as to be the most suited ones.

It is apparent that the present invention is not limited to the above embodiments but may be changed and modified without departing from the scope and spirit of the invention. For example, in each of the embodiments shown above, the control voltage holding circuit is provided for each switch 23. However, it may be provided for every other switch or for every predetermined numbers of switches. Or, the control voltage holding circuit 30 or 61 may be connected to the terminal Td of the switch 23, out of (n−1) switches $23_1$ to $23_{n-1}$, placed between the position of the supply voltage Vcc and the center position on a horizontal line, for example, in the vicinity of the last one of switches constituting one third of the total switches counted from the side of the power source Vcc. Also, the control voltage holding circuit 31 or 61, or both the circuits 31 and 61 may be connected to the terminal Td of the switch 23 placed between the voltage holding circuit 26 and the center position on the horizontal line, for example, in the vicinity of the last one of switches constituting one third of the total switches counted from the side of the voltage holding circuit 26. Moreover, the control voltage holding circuit 61 may be connected to the terminal Td of the switch 23 placed approximately in the center of the horizontal line. By this, more efficient prevention of malfunctions of the semiconductor memory device can be achieved.

In addition, in the above embodiments, the semiconductor memory device is provided with a single input-output line for 1 bit of data, however, the invention is not limited to this. For example, it may be provided with a complementary input-output for 1 bit of data as in the case of a DRAM or SRAM fabricated with CMOS technology where the complementary input-output line is introduced. Furthermore, the present invention can be applied to a semiconductor memory device composed of more than one memory block consisting of two or more memory-cell columns and redundancy memory-cell columns.

Moreover, in the above embodiments, the voltage holding circuit 26 is composed of the fuse 27, buffer 28 and resistor 29. However, the voltage holding circuit 26 can be constructed without using the buffer 28, and can also be configured using a flip flop consisting of two inverters, instead of the buffer. The use of the flip flop can give more efficient effects to the voltage holding circuit at power-on. The voltage holding circuit 26 may be so configured that a supply voltage Vcc is applied to one terminal of a resistor, to the other terminal of which one terminal of a fuse is connected and the other terminal of the fuse is grounded.

There is a risk that, in the semiconductor memory device provided with the control voltage holding circuits 31 and 61, if the PMOS constituting the PMOS 52 or the inverter 62 are large in size, the potentials of the NMOS constituting the buffer 28 built-in the voltage holding circuit 26 or the NMOS constituting the flip-flop are balanced and, as a result, the control voltage is at its intermediate level, causing the switching of the switch 23 to become unstable. To avoid this, the following formula (2) must be satisfied:

$$2 \cdot SN \geq k \cdot Sp \tag{2}$$

where SN represents the size of the NMOS constituting the buffer 28, Sp representing the size of the PMOS constituting the PMOS 52 or the inverter 62 and k representing the number of the control voltage holding circuit 31 and 61 mounted therein.

Moreover, in the above embodiment, as shown in FIG. 1, to fuses $25_1$ to $25_{n-1}$ connected in series is applied the supply voltage Vcc from the leftmost position in the drawing and to the fuses placed in the rightmost position is connected the voltage holding circuit 26. However, the voltage holding circuit 26 may be connected to the fuse placed in the leftmost position in the drawing and the supply voltage Vcc may be applied to the fuse from the rightmost position. The supply voltage Vcc or the ground GND is not necessarily required as a potential to be applied to the fuses connected in series or the voltage holding circuit 26, and simply a "high" or "low" voltage may be used if only the applied voltage can serve to connect the terminal Tc of the switch 23 to the terminal Ta or Tb.

According to configurations of the semiconductor memory device of the present invention, even if the number of bits for inputting and outputting is great, exact values of data can be written and read without malfunctions.

Finally, the present application claims the priority based on Japanese Patent Application No. Hei10-262109 filed on Sep. 16, 1998, which is herein incorporated by reference.

What is claimed is:

1. A semiconductor memory device comprising:
   multiple memory-cell columns each having two or more memory cells;
   input-output lines the number of which is smaller than that of said memory-cell columns;
   switches mounted so as to correspond to said input-output lines and to connect, in response to a control voltage, either of said memory-cell columns adjacent to each other to corresponding input-output lines;
   more than one defective-position setting means connected in series, one terminal of which is held at a "high" level potential and the other terminal of which is held at a "high" or "low" level potential, and wherein a voltage of a point of connection between these means is supplied, as said control voltage, to said two or more switches; and at least one control voltage holding circuit to hold the control voltage supplied to said two or more switches at a "high" or "low" level.

2. A semiconductor memory device comprising:
   two or more memory-cell column groups each having more than one memory-cell column consisting of two or more memory cells;
   column selecting circuits to select, in response to a column address signal, any one of said memory-cell column groups;
   input-output lines the number of which is smaller than that of said column selecting circuit;
   two or more switches mounted so as to correspond to said input-output lines and to connect, in response to a control voltage, either of said column selecting circuits adjacent to each other to corresponding input-output lines;
   more than one defective-position setting means connected in series, one terminal of which is held at a "high" level potential and the other terminal of which is held at a "low" level potential, and wherein a voltage of a point of connection between these means is applied, as said control voltage, to said two or more switches; and
   two or more register columns to turn off any one of said two or more defective-position setting means, to store more than one setting signal to cause remaining other defective-position setting means to be turned on and to select and output any one of setting signals in response to said column address signal; and
   at least one control voltage holding circuit to hold said control voltage supplied to said two or more switches at a "high" or "low" level.

3. The semiconductor memory device according to claim 1 or 2, wherein said control voltage holding circuit comprises a first control voltage holding circuit to hold, in accordance with shut-off states of said defective-position setting means disposed in the vicinity of said control voltage holding circuit, the control voltage supplied to said switches to a "high" or "low" level and wherein said control voltage holding circuit is provided for each said point of connection, for every other said point of connection or for every predetermined numbers of said point of connection.

4. The semiconductor memory device according to claim 1 or 2, wherein said control voltage holding circuit comprises a second control voltage holding circuit to hold the control voltage supplied to said switches at a "high" level and a third control voltage holding circuit to hold the control voltage supplied to said switches at a "low" level, and wherein said second control voltage holding circuit is provided for each said point of connection, for every other said point of connection or for every predetermined numbers of said point of connection disposed between one end of the line to which said point of connection is coupled and approximate center position of said line, or in the vicinity of the last one of points of connection constituting one third of the total points of connection counted from one end of said line to which said point of connection is coupled, and wherein said third control voltage holding circuit is provided for each said point of connection, for every other said point of connection or for every predetermined numbers of said point of connection disposed between the other end of said line to which said point of connection is coupled and approximate center position of said line, or in the vicinity of the last one of points of connection constituting one third of the total points of connection counted from the other end of said line to which said point of connection is coupled.

5. The semiconductor memory device according to claim 4, wherein said first control voltage holding circuit is disposed at a center of said line to which said point of connection is coupled.

6. The semiconductor memory device according to claim 3, wherein said first control voltage holding circuit comprises a first inverter the output terminal of which is connected to a corresponding point of connection and a second inverter the input terminal of which is connected to an output terminal of said first inverter and the output terminal of which is connected to an input terminal of said first inverter.

7. The semiconductor memory device according to claim 4, wherein said second control voltage holding circuit comprises an n-channel MOS transistor the drain of which is connected to a corresponding point of connection and the source voltage of which is held "low" and an inverter the input terminal of which is connected to said drain and the output terminal of which is connected to a gate of said n-channel MOS transistor.

8. The semiconductor memory device according to claim 4, wherein said third control voltage holding circuit comprises a p-channel MOS transistor the drain of which is connected to a corresponding point of connection and the source voltage of which is held "high" and an inverter the input terminal of which is connected to said drain and the output terminal of which is connected to a gate of said p-channel MOS transistor.

9. The semiconductor memory device according to claim 1, wherein said defective-position setting means is composed of fuses.

10. The semiconductor memory device according to claim 3, wherein said defective-position setting means is composed of fuses.

11. The semiconductor memory device according to claim 1 or 2, wherein said defective-position setting means is composed of transistors or transfer gates.

12. The semiconductor memory device according to claim 1, comprising a fuse one terminal of which is held at a "high" level potential, a resistor one terminal of which is connected to said fuse and the other terminal of which is held at a "low" level potential, a voltage holding circuit composed of at least one n-channel MOS transistor and of a buffer the input terminal of which is connected to a point of connection between said fuse and said resistor and the other terminal of which is connected to the other terminal of two or more defective-position setting means connected in series and wherein the potential of other terminal of two or more defective-position setting means connected in series is held "high" or "low" by said voltage holding circuit.

13. The semiconductor memory device according to claim 3, comprising a fuse one terminal of which is held at a "high" level potential, a resistor one terminal of which is connected to said fuse and the other terminal of which is held at a "low" level potential, a voltage holding circuit composed of at least one n-channel MOS transistor and of a buffer the input terminal of which is connected to a point of connection between said fuse and said resistor and the other terminal of which is connected to the other terminal of two or more defective-position setting means connected in series and wherein the potential of other terminal of two or more defective-position setting means connected in series is held "high" or "low" by said voltage holding circuit.

14. The semiconductor memory device according to claim 12, wherein said voltage holding circuit has a flip-flop composed of at least two inverters, instead of said buffer.

15. The semiconductor memory device according to claim 13, wherein said voltage holding circuit has a flip-flop composed of at least two inverters, instead of said buffer.

16. The semiconductor memory device according to claim 12, wherein said inverter comprises an n-channel MOS transistor and p-channel MOS transistor and when SN represents the size of said n-channel MOS transistor constituting said buffer or an n-channel MOS transistor constituting an inverter of said flip-flop, Sp representing the size of a p-channel MOS constituting a first inverter of said first control voltage holding circuit or constituting said third control voltage holding circuit and k representing the number of said first and third control voltage holding circuit, the following formula (3) is satisfied:

$$2 \cdot SN \geq k \cdot Sp \qquad (3).$$

17. The semiconductor memory device according to claim 14, wherein said inverter comprises an n-channel MOS transistor and p-channel MOS transistor and when SN represents the size of said n-channel MOS transistor constituting said buffer or an n-channel MOS transistor constituting an inverter of said flip-flop, Sp representing the size of a p-channel MOS constituting a first inverter of said first control voltage holding circuit or constituting said third control voltage holding circuit and k representing the number of said first and third control voltage holding circuit, the following formula (4) is satisfied:

$$2 \cdot SN \geq k \cdot Sp \qquad (4).$$

* * * * *